United States Patent
Gotterbarm et al.

(10) Patent No.: US 12,225,689 B2
(45) Date of Patent: Feb. 11, 2025

(54) COOLING SYSTEM FOR THE LIQUID IMMERSION COOLING OF ELECTRONIC COMPONENTS

(71) Applicant: WIELAND-WERKE AG, Ulm (DE)

(72) Inventors: Achim Gotterbarm, Dornstadt (DE); Manfred Knab, Dornstadt (DE); Jochen Dietl, Ulm (DE); Harald Gaibler, Rottenacker (DE)

(73) Assignee: WIELAND-WERKE AG, Ulm (DE)

( * ) Notice: Subject to any disclaimer, the term of this patent is extended or adjusted under 35 U.S.C. 154(b) by 263 days.

(21) Appl. No.: 17/996,446

(22) PCT Filed: Mar. 30, 2021

(86) PCT No.: PCT/EP2021/000031
§ 371 (c)(1),
(2) Date: Oct. 18, 2022

(87) PCT Pub. No.: WO2021/213697
PCT Pub. Date: Oct. 28, 2021

(65) Prior Publication Data
US 2023/0209771 A1  Jun. 29, 2023

(30) Foreign Application Priority Data
Apr. 25, 2020 (DE) ............. 10 2020 002 530.7

(51) Int. Cl.
*H05K 7/20* (2006.01)
*H05K 5/06* (2006.01)

(52) U.S. Cl.
CPC ......... *H05K 7/20272* (2013.01); *H05K 5/06* (2013.01); *H05K 7/20236* (2013.01); *H05K 7/20263* (2013.01)

(58) Field of Classification Search
CPC .......... H05K 7/20272; H05K 7/20236; H05K 7/20263; H05K 5/06
(Continued)

(56) References Cited

U.S. PATENT DOCUMENTS 7,983,041 B2  7/2011  Godfroy et al.
10,477,726 B1  11/2019  Enright et al.
(Continued)

FOREIGN PATENT DOCUMENTS

DE  3700708 A1  7/1988

OTHER PUBLICATIONS

International Search Report with English Translation issued in corresponding International Application No. PCT/EP2021/000031 date of mailing Jul. 2, 2021 (5 pages).
(Continued)

*Primary Examiner* — Zhengfu J Feng
(74) *Attorney, Agent, or Firm* — FLYNN THIEL, P.C.

(57) ABSTRACT

A cooling system for the liquid immersion cooling of electronic components. The system includes a container containing, in an interior, liquid heat transfer fluid into which electronic components are immersed, the container having a gas space above the surface of the liquid heat transfer fluid, and a heat exchanger device in the gas space of the container for forming liquid heat transfer fluid. The cooling system further includes a lock device on the container for exchanging electronic components, and the lock device has a lock space, which lock space is hermetically sealed with respect to the gas space of the container to prevent gas exchange.

10 Claims, 2 Drawing Sheets

(58) Field of Classification Search
USPC .......................................................... 361/699
See application file for complete search history.

(56) References Cited

U.S. PATENT DOCUMENTS

| | | | |
|---|---|---|---|
| 10,512,192 B2* | 12/2019 | Miyoshi | H01L 21/67109 |
| 2017/0280587 A1* | 9/2017 | Watanabe | H05K 7/20236 |
| 2019/0357379 A1* | 11/2019 | Kolar | H05K 7/20827 |
| 2020/0022289 A1 | 1/2020 | Marazzo | |
| 2020/0093038 A1* | 3/2020 | Enright | H05K 7/20318 |
| 2020/0253086 A1* | 8/2020 | Ohga | H05K 7/20272 |

OTHER PUBLICATIONS

Written Opinion of International Searching Authority issued in corresponding International Application No. PCT/EP2021/000031 dated Jul. 2, 2021 (7 pages).

German Office Action issued in corresponding German Application No. 10 2020 002 530.7 date of mailing Mar. 16, 2021 (8 pages).

\* cited by examiner

COOLING SYSTEM FOR THE LIQUID IMMERSION COOLING OF ELECTRONIC COMPONENTS

TECHNICAL FIELD

The invention relates to a cooling system for the liquid immersion cooling of electronic components, including a container containing, in an interior, liquid heat transfer fluid into which electronic components can be immersed. The container has a gas space above a surface of the liquid heat transfer fluid. A heat exchanger device in the gas space of the container forms liquid heat transfer fluid and the cooling system has a lock device on the container for exchanging electronic components.

BACKGROUND AND SUMMARY

Cooling systems for liquid immersion cooling, for example as two-phase immersion cooling systems, are an active cooling solution for electronic components which generate a significant amount of heat during operation. When the components are immersed in a heat transfer fluid, which generally has a relatively low boiling point, the heat generated by the electronic component may evaporate the surrounding liquid heat transfer fluid, whereby heat is dissipated from the electronic component. A condenser device liquefies the vaporous heat transfer fluid which is then returned into the reservoir for cooling.

A two-phase immersion cooling system comprising a cooling basin is disclosed in the publication U.S. Pat. No. 10,512,192. A condensation chamber, in which the gaseous fluid produced during the cooling process is condensed, is connected to the liquid fluid in the cooling basin. In this case, a vapor redirection structure is arranged above the heat-generating electronic components which are located inside the cooling medium in the cooling basin. The evaporated fluid is conducted by means of the vapor redirection structure into the condensation chamber for liquefaction.

If the immersion cooling system is opened, however, in order to permit access to the electronic components or for other system maintenance, a certain loss of heat transfer fluid occurs, by vaporous fluid escaping into the environment. Reducing the quantity of lost heat transfer fluid is environmentally friendly and may bring about significant cost savings during the operation of a two-phase immersion cooling system.

In this context, a cooling system for computer components is disclosed in U.S. Pat. No. 10,477,726. In the interior of a pressure-controlled container, the internal pressure is reduced to 650 hPa. A heat-conducting, dielectric heat transfer fluid is in the container in the liquid and gaseous phase, said heat transfer fluid having a boiling point of below 80° C. at atmospheric pressure. Computer components which are at least partially immersed in the liquid phase of the fluid are arranged in the container. The dielectric gas-phase fluid, which has been evaporated by the heat development of the computer components, is condensed by means of a condenser to form dielectric liquid-phase fluid. An air lock on the pressure-controlled container serves for exchanging computer components in the operating state, components to be exchanged being able to be replaced via said air lock by means of a robot device.

Robotic arms in the pressure-controlled container and outside thereof serve for exchanging a component. If an electronic component does not function correctly, a removal sequence is initiated to this end. In this case, the internal arm removes the corresponding computer component and deposits it through the inner air lock door in the interior of the air lock. As soon as this sequence is completed, the inner air lock door is closed, the air lock pressure is equalized with that of the external atmosphere and an outer air lock door is opened. As soon as the outer door has been opened, an external robotic arm system removes the component from the air lock.

The interior of the air lock may be purged with nitrogen and/or a different inert gas before the air lock is opened to the outside environment. This has the effect that the loss of dielectric fluid vapor is kept lower and, in particular, also that no air passes from the environment into the interior of the vessel. Nevertheless, a gas exchange of the inert gas used is carried out from the air lock into the interior of the cooling system.

The object of the invention is to develop a cooling system for the liquid immersion cooling of electronic components relative to reducing the loss of heat transfer fluid.

One aspect of the invention encompasses a cooling system for the liquid immersion cooling of electronic components. The cooling system comprises a container containing, in the interior, liquid heat transfer fluid, into which electronic components can be immersed, wherein the container has a gas space above the surface of the liquid heat transfer fluid. Additionally, the cooling system has a heat exchanger device in the gas space of the container for forming liquid heat transfer fluid. The cooling system has a lock device on the container for exchanging electronic components. The lock device has a lock space which is hermetically sealed with respect to the gas space of the container to prevent gas exchange.

Additionally, the cooling system may advantageously have a control device which is designed to regulate the operation of the fluid circulation, for example as a function of the temperature of the heat transfer fluid and the pressure conditions in the container and/or in the lock device.

The invention is based on the observation that, due to the hermetic seal, no air, water vapor or even inert gas is able to pass into the container having the cooled electronic components. Thus, in the cooling process the gaseous heat transfer fluid is not contaminated by foreign gases. This is implemented by a barrier which separates the lock space from the container and prevents an exchange of substances with the gaseous heat transfer fluid. The lock device is sealed in a completely leak-proof manner relative to an exchange of material with the container. This is achieved, in particular, by liquid heat transfer fluid being used to seal the lock relative to a passage of gas. In this case, the transfer region from the container to the lock space is filled with liquid heat transfer fluid.

Electronic components are arranged in the container in a bath of heat transfer fluid in a manner which is suitable for cooling, said electronic components being cooled by the evaporation of this liquid fluid. In this case, the proportion of non-condensable gases may be removed from the system before and/or during commissioning. To form liquid heat transfer fluid, the heat exchanger device of the cooling system may be designed as a bundle of heat exchanger tubes in the gas space of the container. In this case, a plurality of tube bundles may also be arranged so as to be distributed in the gas space of the container.

The lock device is suitable for the parts to be able to be supplied between the environment and the container virtually without a pressure difference, via the lock which is hermetically sealed relative to a gas exchange, and thus the penetration of air and other media into the system and the loss of heat transfer fluid from the system is prevented or at least substantially reduced. In this case, the lock device may also be designed to be detachable from the container. For example, the lock may be designed as a module which may be introduced into the container and may be removed again, and which is immersed into the liquid heat transfer fluid at a certain immersion depth. For example, a square or rectangular four-sided module is suitable, said module in the state ready for use being immersed in the container by the lower opening into the liquid heat transfer fluid, and the upper opening thereof being able to be closed by a cover relative to the external environment.

The lock space of the lock device may also be flooded with the heat transfer fluid from the container or a separate storage container. This is achieved, for example, by the gas pressure in the container being correspondingly increased to such a level that, according to the principle of communicating tubes, liquid heat transfer fluid enters the lock space according to the pressure conditions and displaces the gas present therein. Due to suitable pressure conditions of the external pressure and internal pressure, for the exchange of electronic components the lock space may also be completely flooded with liquid heat transfer fluid. After the lock device is closed relative to the external environment, then no external air or any other foreign gases are present in the lock space.

Electronic components are arranged in the container in the bath of heat transfer fluid in a manner suitable for the pre-cooling requirement and are cooled by the evaporation of this fluid. By means of sensors, a monitoring and control of pressure, temperature, conductivity and all parameters relevant to the method are undertaken by a control device.

The particular advantage is that by means of the lock device the cooling systems are designed in an optimized manner regarding efficiency, loss of heat transfer fluid and moisture input into the system.

In a preferred embodiment of the invention, a partition may be arranged for the hermetic sealing of the lock space, said partition being immersed to an immersion depth in the liquid heat transfer fluid. This results in the creation of a siphon which is formed by the liquid heat transfer fluid and which seals the gas space in the container and the gas space of the lock space relative to a gas exchange.

Advantageously, the immersion depth of the partition may be designed to be variable. As a result, when the lock device is closed, the partition may be at least partially removed for simple further positioning of the electronic components in their operating position. This partition may be displaced, for example, or even removed by a folding mechanism.

In an advantageous embodiment of the invention, a loading system may be arranged in the container, the electronic components being able to be transported thereby from the lock device to the operating position for the exchange of said components. A loading system may consist of robotic arms or linear drive devices. With a suitable configuration of the device, an exchange of the components may be carried out via a fully automatic loading system. Alternatively, gloves may also be arranged at suitable container openings, for exchanging the electronic components from the lock device to the operating position. Thus, loading is possible according to the principle of a gas-tight glove box, by means of the manual access to the interior of the container.

In an advantageous embodiment of the invention, a storage device for the intermediate storage of electronic components may be provided in the lock space. When provided with an additional or adjacent storage device, access to the components to be exchanged is possible in a simple manner without opening the cooling system.

Advantageously, a further heat exchanger device may be designed as a lock cooling system, which may specifically control the temperature of the heat transfer fluid located in the lock space. The heat transfer fluid located in the lock may thus be temperature-controlled separately from the entire circuit. As a result, possible residues of gaseous heat transfer fluid may also be transferred into the liquid phase. The liquefaction of the vapor may take place by an integrated or adjacent condenser. Moreover, it is advantageous to keep the gas pressure low when opening the lock device to the outside, by a cool heat transfer fluid in the lock space.

In an advantageous embodiment, the lock device and/or the container may have a degassing device, non-condensable gases being able to be separated thereby from the gaseous heat transfer fluid. In this manner, the small proportion of gas which penetrates the cooling system may also be removed from the cooling circuit.

Advantageously, the lock device may be flooded with a protective gas via a gas connection. In particular, interfering residual gases, such as for example ambient air, may be removed from the lock space by inert gases.

Advantageously, a pressure equalization tank may also be arranged on the container and/or on the lock device. The level of the liquid fluid phase in the gas space of the container and in the lock space may be accurately regulated by a pressure equalization tank. Degassing processes in the lock space, for example after a lock process, may also be carried out by such a device.

Advantageously, the container may be provided with an auxiliary heating system which serves as an aid for the evaporation of the heat transfer fluid. This device may undertake a pressure regulation of the cooling system independently of the operation of the electronic components or the cooling power of the heat exchanger device.

In an advantageous embodiment of the invention, the container may be designed as a pressure vessel which operates at a negative pressure and/or positive pressure. To lock electronic components, for regulating the level of the liquid fluid level in the lock space, it may be necessary to regulate the pressure level relative to the ambient pressure of the air. Thus, both at negative pressure and at positive pressure the cooling system may be adjusted in a variable manner relative to the surrounding atmosphere without negatively impairing or interrupting the operation.

BRIEF DESCRIPTION OF THE DRAWINGS

Exemplary embodiments of the invention are described in more detail by way of the schematic drawings.

DETAILED DESCRIPTION

Figure 1:
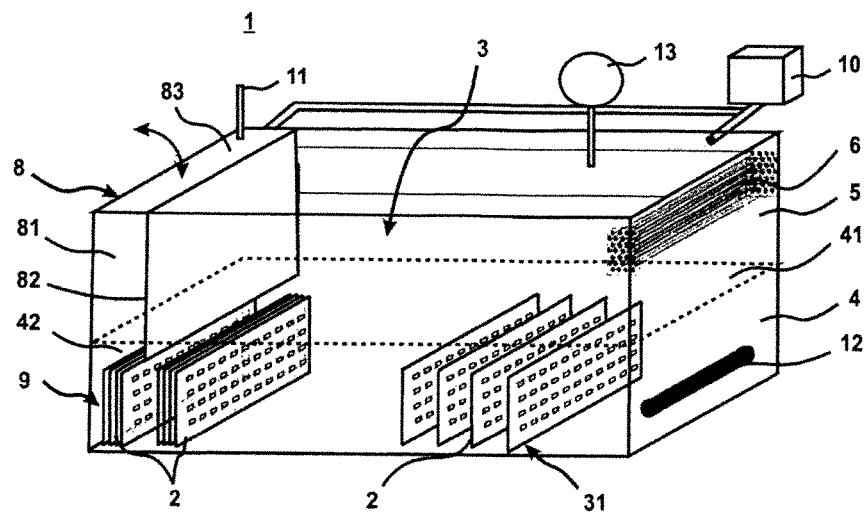
FIG. 1 shows a schematic oblique view of a cooling system.

Parts which correspond to one another are provided in all of the figures with the same reference numerals.

FIG. 1 shows a schematic oblique view of a cooling system 1 for the liquid immersion cooling of electronic components 2. The cooling system 1 comprises a container 3 and a lock device 8 for the exchange of electronic components 2. The liquid dielectric heat transfer fluid 4 located in the interior of the container 3 extends into the lock space 81 of the lock device 8. The liquid heat transfer fluid 42 located in the lock space 81 forms, together with the partition 82 relative to the gas space 5 of the container 3, a hermetic seal against a gas exchange. For the hermetic seal, the partition 82 is immersed in the liquid heat transfer fluid 4 and thus separates the lock space 81 from the gas space 5 of the container 3 on the gas side.

In the cooling system 1 an automatic loading system, not shown in FIG. 1, may be arranged in the container 3, the electronic components 2 being able to be transported thereby from the lock device 8 to the operating position 31 for exchanging said components. The electronic components 3 may be transported by gripper arms of robots or linear transport systems, which in an automated manner collect electronic components 2 to be exchanged from the operating position 31 and, for example, deposit said components in the storage device 9 of the lock device 8. In the reverse sequence, electronic components 2 to be installed, which are ready for operation, are collected from the storage device 9 by means of the loading system and transferred into the operating position 31. The lock device 8 itself may also be operated from outside by automated devices.

For exchanging electronic components 2, the cover 83 of the lock device 8 is opened and a component 2 is deposited in the lock in the storage device 9. From there, defective parts are moved via the lock to the outside. Before opening the cover 83, inert gas may be introduced via a gas connection 11, for example, into the lock space 81, said insert gas then being at least partially discharged together with a proportion of gaseous heat transfer fluid located in the lock space 81 via a degassing device 10. This results in a purging process of the lock space 81, such that when the cover 83 is opened no gaseous heat transfer fluid, or only an exceptionally small proportion of gaseous heat transfer fluid, escapes from the lock. After the cover 83 is closed, the lock space 81 may be freed of ambient air by a renewed purging process with inert gas. If a pressure equalization in the locks were to be required relative to the atmospheric pressure of the environment, a pressure equalization tank 13 could create the required pressure in the gas space 5. Similarly, a pressure equalization may be carried out during the lock process via an auxiliary heating system 12 which is arranged in the liquid heat transfer fluid 4 in the container 3. In this case, over the lock period the auxiliary heating system 12 enhances the cooling system 1, which otherwise works under negative pressure, and raises the internal pressure in the gas space 5 and thus produces the required pressure equalization. The cooling power of the heat exchanger device 6 is not further influenced thereby. Nevertheless, this may also be used for a pressure regulation.

Figure 2:
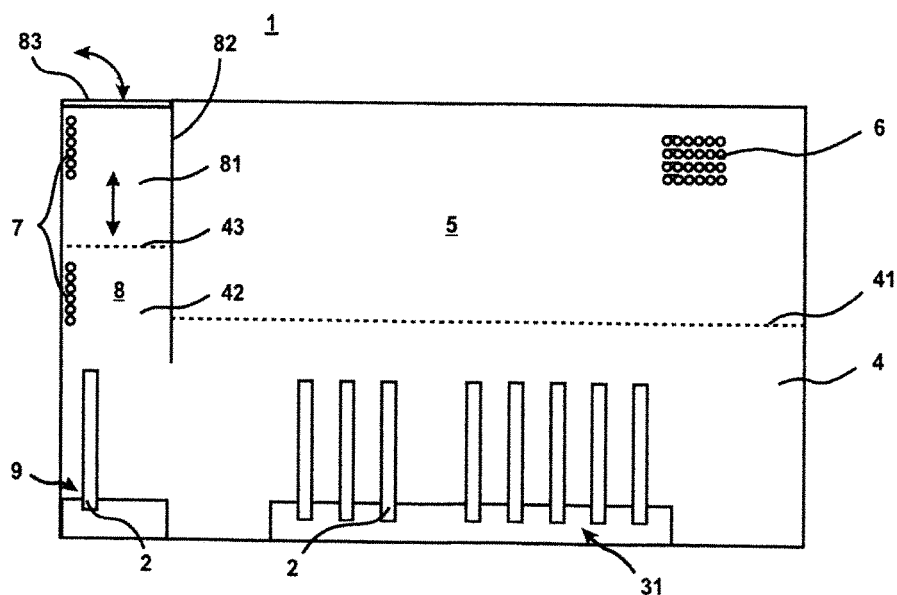
FIG. 2 shows a schematic front view of a cooling system with an advantageous embodiment of a lock device.

FIG. 2 shows a schematic front view of a cooling system 1 with an advantageous embodiment of a lock device 8. A lock cooling system 7 is arranged in the lock device 8, said lock cooling system liquefying the residual components of the gaseous heat transfer fluid and also further reducing the temperature of the liquid heat transfer fluid 4 in the lock space 81. As a result, in particular, the partial pressure of the heat transfer fluid during the lock process of electronic components 2 is reduced in the lock device 8. If a positive pressure is created in the gas space 5, the fluid surface 43 in the lock device 8 rises. As a result, the gas volume in the lock space 81 is reduced. When the cover 83 is opened, therefore, a reduced gas exchange takes place with the ambient air, or no gas exchange takes place when the lock space 81 is completely flooded.

Figure 3:
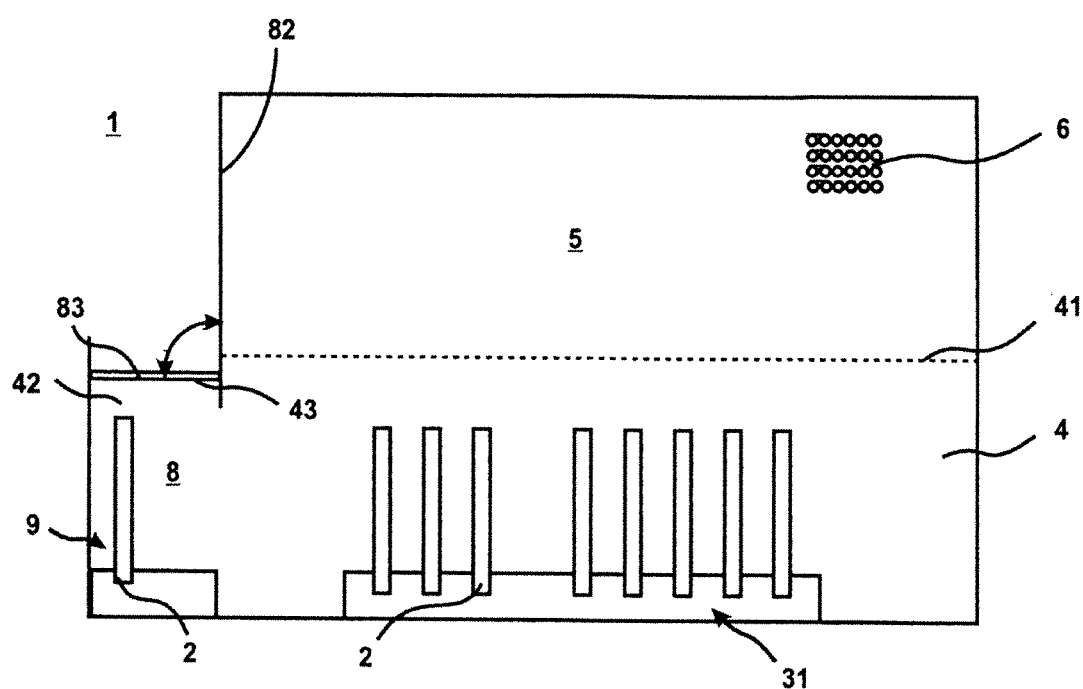
FIG. 3 shows a schematic front view of a cooling system with a further embodiment of a lock device.

FIG. 3 shows a schematic front view of a cooling system 1 with a further embodiment of a lock device 8. In this lock device, the fluid surface 41 in the gas space 5 may be at a higher level relative to the fluid surface 43 in the lock space 8 and vice-versa depending on whether a negative pressure or positive pressure prevails in the gas space 5 during the cooling process. The cover 83 which closes relative to the outside is now directly placed on the liquid heat transfer fluid 42 in the lock device 8. After a lock process, the cover 83 seals the lock space 81 entirely relative to the outside air. An exchange of electronic components 2 may now be undertaken directly after opening the cover 83. In this case, a simple loading or emptying of the easily accessible storage device 9 may also be undertaken. After the lock process, the outside air is immediately displaced by the cover 83. To this end, small closable ventilation holes may be arranged in the cover 83.

The invention claimed is:
1. A cooling system for liquid immersion cooling of electronic components, comprising:
   a container having an interior and containing, in the interior, liquid heat transfer fluid, the electronic components being immersible in the liquid heat transfer fluid, the container further including a gas space above a surface of the liquid heat transfer fluid;
   a heat exchanger device in the gas space of the container for forming the liquid heat transfer fluid;
   a lock device on the container for exchanging the electronic components,
   the lock device having a lock space,
   the lock space being hermetically sealed with respect to the gas space of the container to prevent gas exchange; and
   a partition arranged to hermetically seal the lock space, the partition being immersed to an immersion depth in the liquid heat transfer fluid.

2. The cooling system as claimed in claim 1, wherein the immersion depth of the partition is variable.

3. The cooling system as claimed in claim 1, further including a loading system arranged in the container, the loading system transporting the electronic components from the lock device to an operating position for exchange of the electronic components.

4. The cooling system as claimed in claim 1, further including a storage device disposed in the lock space for the intermediate storage of the electronic components.

5. The cooling system as claimed in claim 1, wherein the heat exchanger device is a first heat exchanger device, and the cooling system includes a second heat exchanger device configured as a lock cooling system, the locking cooling system being configured to specifically control a temperature of the liquid heat transfer fluid located in the lock space.

6. A cooling system for liquid immersion cooling of electronic components comprising:
   a container having an interior and containing, in the interior, liquid heat transfer fluid, the electronic components being immersible in the liquid heat transfer fluid, the container further including a gas space above a surface of the liquid heat transfer fluid;
   a heat exchanger device in the gas space of the container for forming the liquid heat transfer fluid; and
   a lock device on the container for exchanging the electronic components, the lock device having a lock space, the lock space being hermetically sealed with respect to the gas space of the container to prevent gas exchange;

wherein the lock device and/or the container includes a degassing device, the degassing device separating non-condensable gases from gaseous heat transfer fluid.

7. A cooling system for liquid immersion cooling of electronic components comprising:
- a container having an interior and containing, in the interior, liquid heat transfer fluid, the electronic components being immersible in the liquid heat transfer fluid, the container further including a gas space above a surface of the liquid heat transfer fluid;
- a heat exchanger in the gas space of the container for forming the liquid heat transfer fluid;
- a lock device on the container for exchanging the electronic components, the lock device having a lock space, the lock space being hermetically sealed with respect to the gas space of the container to prevent gas exchange; and
- a gas connection, the lock device being flooded with a protective gas via the gas connection.

8. The cooling system as claimed in claim 1, further including a pressure equalization tank arranged on the container and/or on the lock device.

9. The cooling system as claimed in claim 1, wherein the container includes an auxiliary heating system, the auxiliary heating system serving as an aid for evaporation of the liquid heat transfer fluid.

10. The cooling system as claimed in claim 1, wherein the container is configured as a pressure vessel operating at a negative pressure and/or a positive pressure.

* * * * *

UNITED STATES PATENT AND TRADEMARK OFFICE
CERTIFICATE OF CORRECTION

PATENT NO. : 12,225,689 B2
APPLICATION NO. : 17/996446
DATED : February 11, 2025
INVENTOR(S) : Achim Gotterbarm et al.

Page 1 of 1

It is certified that error appears in the above-identified patent and that said Letters Patent is hereby corrected as shown below:

In the Claims

Claim 4, Column 6, Lines 47 - 48; change "the lock space for the intermediate" to ---the lock space for intermediate---

Claim 7, Column 7, Line 5; change "components comprising:" to ---components, comprising:---

Claim 7, Column 7, Line 11; change "a heat exchanger in the gas space" to ---a heat exchanger device in the gas space---

Signed and Sealed this
Eighteenth Day of March, 2025

Coke Morgan Stewart
*Acting Director of the United States Patent and Trademark Office*